(12) United States Patent
Tran et al.

(10) Patent No.: US 12,274,056 B2
(45) Date of Patent: *Apr. 8, 2025

(54) MEMORY ARRAY AND METHODS USED IN FORMING A MEMORY ARRAY

(71) Applicant: Micron Technology, Inc., Boise, ID (US)

(72) Inventors: Luan C. Tran, Meridian, ID (US); Guangyu Huang, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/433,863

(22) Filed: Feb. 6, 2024

(65) Prior Publication Data

US 2024/0244837 A1    Jul. 18, 2024

Related U.S. Application Data

(60) Continuation of application No. 17/746,649, filed on May 17, 2022, now Pat. No. 11,937,423, which is a
(Continued)

(51) Int. Cl.
*H10B 41/27* (2023.01)
*G11C 5/06* (2006.01)
(Continued)

(52) U.S. Cl.
CPC ............. *H10B 41/27* (2023.02); *G11C 5/063* (2013.01); *H10B 41/35* (2023.02); *H10B 41/60* (2023.02); *H10B 43/27* (2023.02); *H10B 43/35* (2023.02)

(58) Field of Classification Search
CPC ......... G11C 5/063; H10B 41/27; H10B 43/27
See application file for complete search history.

(56) References Cited

U.S. PATENT DOCUMENTS 9,741,737 B1    8/2017 Huang et al.
10,014,309 B2    7/2018 Dorhout et al.
(Continued)

FOREIGN PATENT DOCUMENTS

CN    107706190    2/2018
CN    202010125017.5    12/2022

*Primary Examiner* — Eric K Ashbahian
(74) *Attorney, Agent, or Firm* — Wells St. John P.S.

(57) ABSTRACT

A method used in forming a memory array, comprises forming a substrate comprising a conductive tier, an insulator etch-stop tier above the conductive tier, a select gate tier above the insulator etch-stop tier, and a stack comprising vertically-alternating insulative tiers and wordline tiers above the select gate tier. Etching is conducted through the insulative tiers, the wordline tiers, and the select gate tier to and stopping on the insulator etch-stop tier to form channel openings that have individual bottoms comprising the insulator etch-stop tier. The insulator etch-stop tier is penetrated through to extend individual of the channel openings therethrough to the conductive tier. Channel material is formed in the individual channel openings elevationally along the insulative tiers, the wordline tiers, and the select gate tier and is directly electrically coupled with the conductive material in the conductive tier. Structure independent of method is disclosed.

10 Claims, 12 Drawing Sheets

Related U.S. Application Data division of application No. 16/288,982, filed on Feb. 28, 2019, now Pat. No. 11,380,699.

(51) Int. Cl.
*H10B 41/35* (2023.01)
*H10B 41/60* (2023.01)
*H10B 43/27* (2023.01)
*H10B 43/35* (2023.01)

(56) References Cited

U.S. PATENT DOCUMENTS

| | | |
|---|---|---|
| 10,734,403 B2 | 8/2020 | Eom et al. |
| 11,937,423 B2* | 3/2024 | Tran ............... H10B 43/35 |
| 2009/0101960 A1 | 4/2009 | Aoki et al. |
| 2011/0121403 A1* | 5/2011 | Lee .................. H10B 41/27 |
| | | 257/E27.06 |
| 2011/0287612 A1 | 11/2011 | Lee et al. |
| 2012/0058629 A1 | 3/2012 | You et al. |
| 2013/0146980 A1 | 6/2013 | Tanzawa |
| 2013/0148400 A1 | 6/2013 | Murooka |
| 2014/0264360 A1 | 9/2014 | Huang et al. |
| 2014/0291747 A1* | 10/2014 | Simsek-Ege ........ H01L 21/3085 |
| | | 438/266 |
| 2015/0140753 A1 | 5/2015 | Simsek-Ege et al. |
| 2016/0099323 A1* | 4/2016 | Hopkins ............ H10B 43/27 |
| | | 438/258 |
| 2017/0117049 A1* | 4/2017 | Rajwade ............ G11C 16/16 |
| 2017/0148809 A1 | 5/2017 | Nishikawa et al. |
| 2018/0090373 A1 | 3/2018 | Sharangpani et al. |
| 2018/0366386 A1* | 12/2018 | Petz ................. H01L 21/02148 |
| 2019/0295956 A1* | 9/2019 | Kawai ............... G11C 16/08 |
| 2020/0111808 A1 | 4/2020 | Liu et al. |
| 2020/0266146 A1 | 8/2020 | Nishida |

\* cited by examiner

MEMORY ARRAY AND METHODS USED IN FORMING A MEMORY ARRAY

RELATED PATENT DATA

This patent resulted from a continuation of U.S. patent application Ser. No. 17/746,649 filed May 17, 2022, which is a divisional of U.S. patent application Ser. No. 16/288,982 filed Feb. 28, 2019, now U.S. Pat. No. 11,380,699, each of which is hereby incorporated by reference herein.

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

DETAILED DESCRIPTION OF EXAMPLE EMBODIMENTS

Embodiments of the invention encompass methods used in forming an array of transistors and/or memory comprising memory cells (e.g., in strings), for example an array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or memory cells (e.g., NAND or other memory cells) independent of method of manufacture. First example method embodiments are described with reference to FIGS. 1-17 which may be considered as a "gate-last" or "replacement-gate" process.

Figure 1:
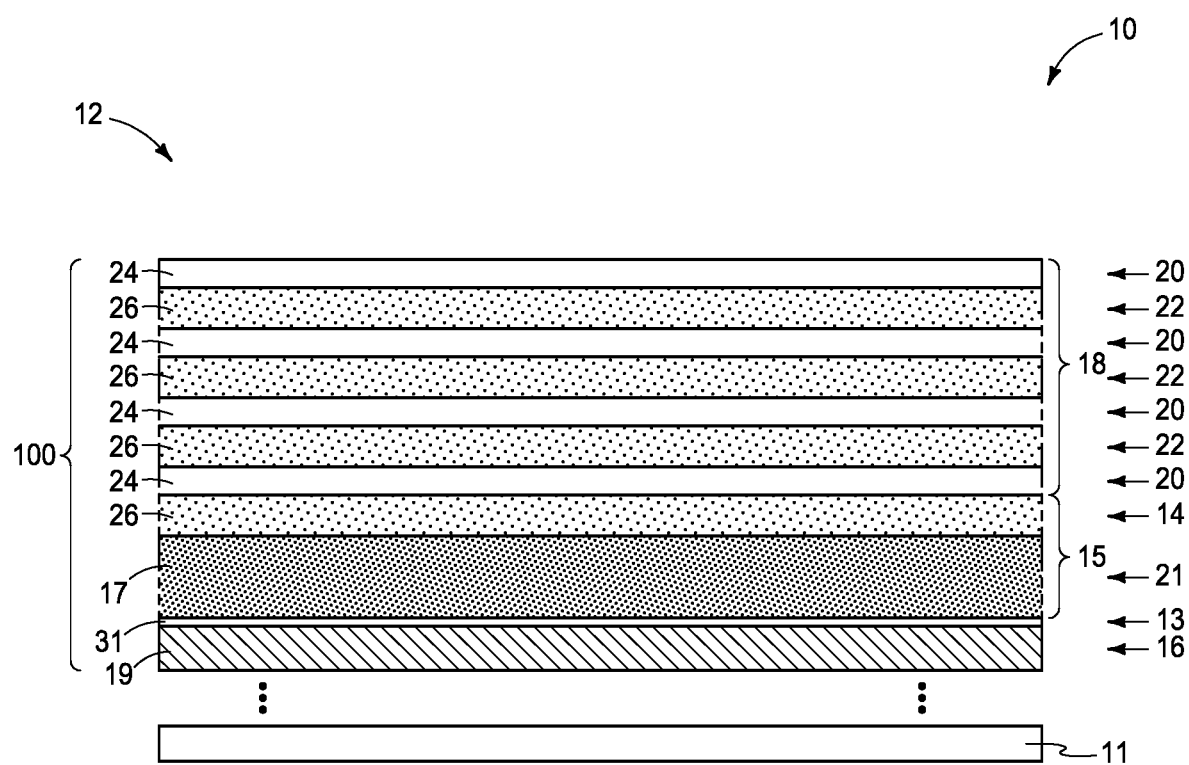
FIG. 1 is a diagrammatic cross-sectional view of a portion of a substrate in process in accordance with embodiments of the invention.

FIG. 1 shows a construction 10 in a method of forming an array 12 of elevationally-extending strings of transistors and/or memory cells (not yet shown). Construction 10 comprises a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate/construction 10 comprises a conductive tier 16. Example conductive tier 16 is shown as comprising conductive material 19 (e.g., conductively-doped semiconductive material such as conductively-doped polysilicon above metal material such as WSi$_x$). Conductive tier 16 may comprise part of control circuitry (e.g., peripheral-under-array circuitry) used to control read and write access to the transistors and/or memory cells that will be formed within array 12.

An insulator etch-stop tier 13 is above conductive tier 16. Such is shown as comprising insulator material 31, with examples including silicon dioxide, aluminum oxide, hafnium oxide, zirconium oxide, an insulative metal oxide comprising multiple different metal elements (e.g., Al, Hf, Zr, etc.), silicon nitride, and combinations of such materials. An example thickness for insulator etch-stop tier 13 is from 10 to 40 nanometers.

A select gate tier is above insulator etch-stop tier 13 and may be vertically thicker than the select gate tier. In one embodiment, construction 10 comprises more than one select gate tier. The example construction of FIG. 1 is shown as comprising a stack 15, which may be considered in some embodiments as a first stack 15, comprising multiple select gate tiers 21 and 14 above insulator etch-stop tier 13. More select gate tiers (not shown in FIG. 1) may be in first stack 15. In some embodiments, select gate tier 14 is referred to as one select gate tier 14 and select gate tier 21 is referred as another select gate tier 21. In one embodiment, the another select gate tier 21 is vertically thicker than the one select gate tier 14 (as shown), and in another embodiment the one select gate tier is vertically thicker than the another select gate tier (not shown in FIG. 1). Example thicknesses for select gate tier 21 and 14 are 100 to 200 nanometers and 30 to 60 nanometers, respectively. Insulative material/tiers (not shown) may separate immediately-adjacent select gate tiers when multiple select gate tiers are present. Regardless, select gate tiers 21 and 14 will ultimately comprise one or more select gates, and in one embodiment one or more source select gates (individually commonly referred to as a select gate source [SGS]). A select gate tier may not comprise conductive material at this point in the processing and where multiple select gate tiers are present, some may be conductive and some may be insulative at this point in the processing. Further, two or more of multiple select gates in stack 15 (not yet shown) may be directly electrically coupled, or otherwise electrically coupled, relative one another in a finished circuitry construction. Regardless, in one embodiment stack 15 comprises both conductive metal material and conductively-doped semiconductive material (e.g., conductively-doped polysilicon) in different ones of the select gate tiers in a finished circuitry construction. In one embodiment, the conductive metal material is above the conductively-doped semiconductive material in the finished circuitry construction, and in another embodiment the conductive metal material is below the conductively-doped semiconductive material in the finished circuitry construction. If there are three or more select gate tiers (not shown in FIG. 1), the conductive metal material may be both above and below the conductively-doped semiconductive material in the finished circuitry construction and/or the conductively-doped semiconductive material may be both above and below the conductive metal material.

Select gate tier 21 is shown as comprising material 17 and select gate tier 14 is shown as comprising material 26, and one or both of which may be wholly or partially sacrificial. An example material 17 is conductively-doped semiconductive material (e.g., conductively-doped polysilicon) and an example material 26 is silicon nitride in conjunction with the hereby initially-described example method embodiment which is "gate-last" or "replacement-gate".

Substrate construction 10 comprises a stack 18, in some embodiments referred to as a second stack 18, above the one or more select gate tiers (e.g., above first stack 15 when present). Stack 18 comprises vertically-alternating insulative tiers 20 and wordline tiers 22. Example thickness for each of tiers 20 and 22 is 25 to 60 nanometers. In one embodiment, insulator etch-stop tier 13 is vertically thinner than insulative tiers 20 and wordline tiers 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductive tier 16 and stack 18. For example, multiple vertically-alternating tiers of conductive material and insulative material of such circuitry may be below a lowest of the wordline tiers 22 and/or above an uppermost of the wordline tiers 22. Regardless, wordline tiers 22 may not comprise conductive material and insulative tiers 20 may not comprise insulative material or be insulative at this point in processing. Example wordline tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Select gate tiers 21 and 14 in some embodiments may be considered as lower select gate tiers. Upper select gate tiers (not shown) may be formed above stack 18 and have upper select gates (e.g., having drain select gates commonly referred to individually as a select gate drain [SGD] and not shown). Collectively, stack 18 and tiers 16, 13, 21, and 14 may be considered as a stack 100 (and may include upper select gate tiers that are not shown). Only one stack 18 and one stack 100 are shown, although more than one stack 18 and/or one stack 100 may be above or below (not shown) stack 18 and/or stack 100 above or below substrate 11.

Etching is conducted through the insulative tiers, the wordline tiers, and the select gate tier to and stopping on the insulator etch-stop tier to form channel openings that have individual bottoms comprising the insulator etch-stop tier. In one such embodiment, the material of the another select gate tier is conductive at this point in the process and etching is first conducted through the insulative tiers, the wordline tiers, and one of the select gate tiers to and stopping on conductor material in another of the select gate tiers that is below the one select gate tier to form the channel-opening bottoms to comprise the conductor material in the another select gate tier. This is followed by etching through the another select gate tier to extend individual of the channel openings there-through to and stopping on the insulator etch-stop tier to form the individual bottoms of the channel openings to comprise the insulator etch-stop tier.

Figure 2:
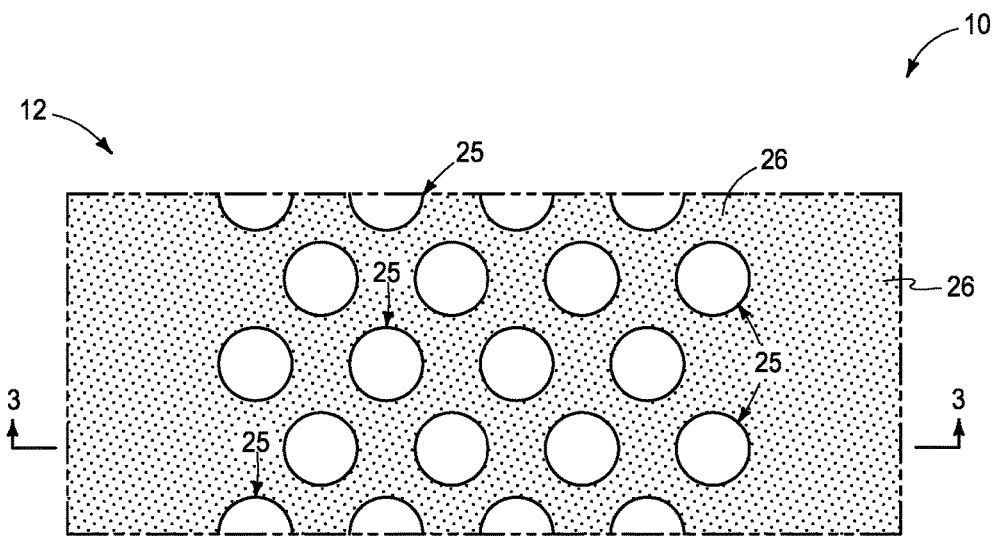
FIGS. 2-17 are diagrammatic sequential sectional and/or enlarged views of the construction of FIG. 1 in process in accordance with some embodiments of the invention.
Figure 3:
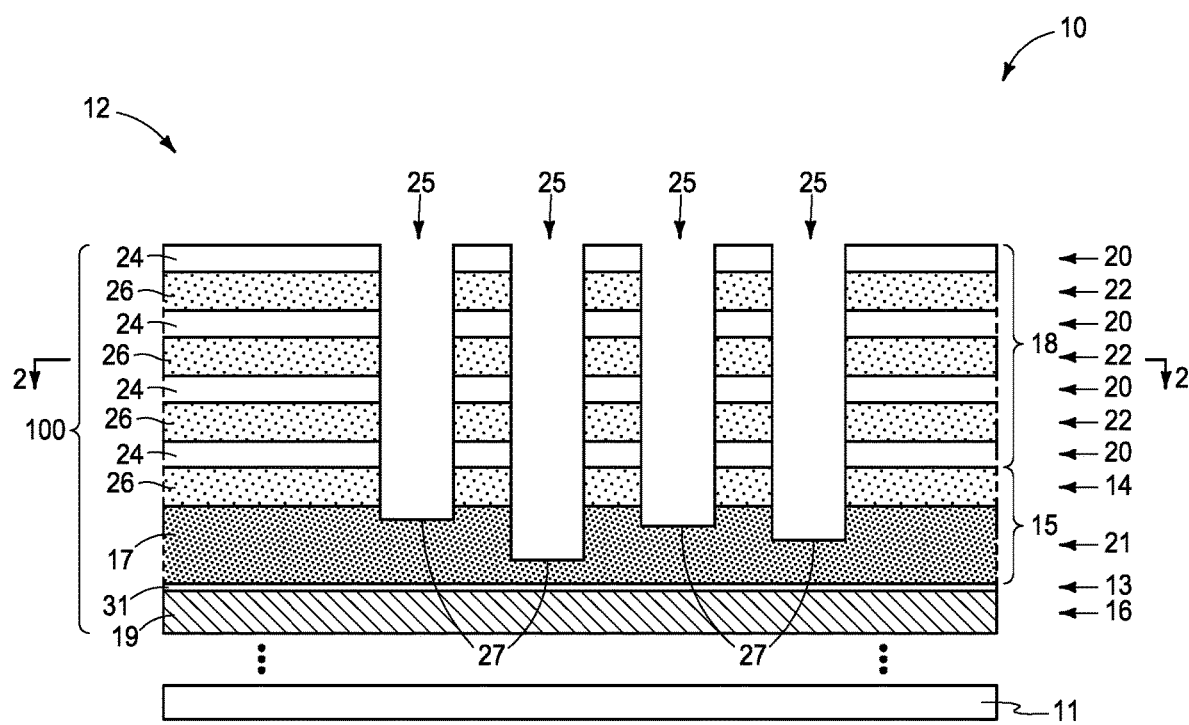

For example, and referring to FIGS. 2 and 3, channel openings 25 have been etched through insulative tiers 20, wordline tiers 22, and the one select gate tier 14 to and stopping on conductor material 17 in the another select gate tier 21, thus forming channel openings 25 to have individual bottoms 27 comprising conductor material 17 of the another select gate tier 21. Such may be conducted, for example, by a timed dry anisotropic etch using a chemistry selective to etch material 17 after etching through material 26 immediately there-above using a different etching chemistry. Alternately, by way of example, such etching into material 17 may occur as an over-etch at the conclusion of etching through material 26 immediately there-above (e.g., no change in chemistry). Regardless, channel openings 25 as etched into material 17 may be to different depths in material 17, for example as shown. By way of example only, channel openings 25 are shown as being arranged in groups or columns of staggered rows of four openings 25 per row. Any alternate existing or future-developed arrangement and construction may be used.

Figure 4:
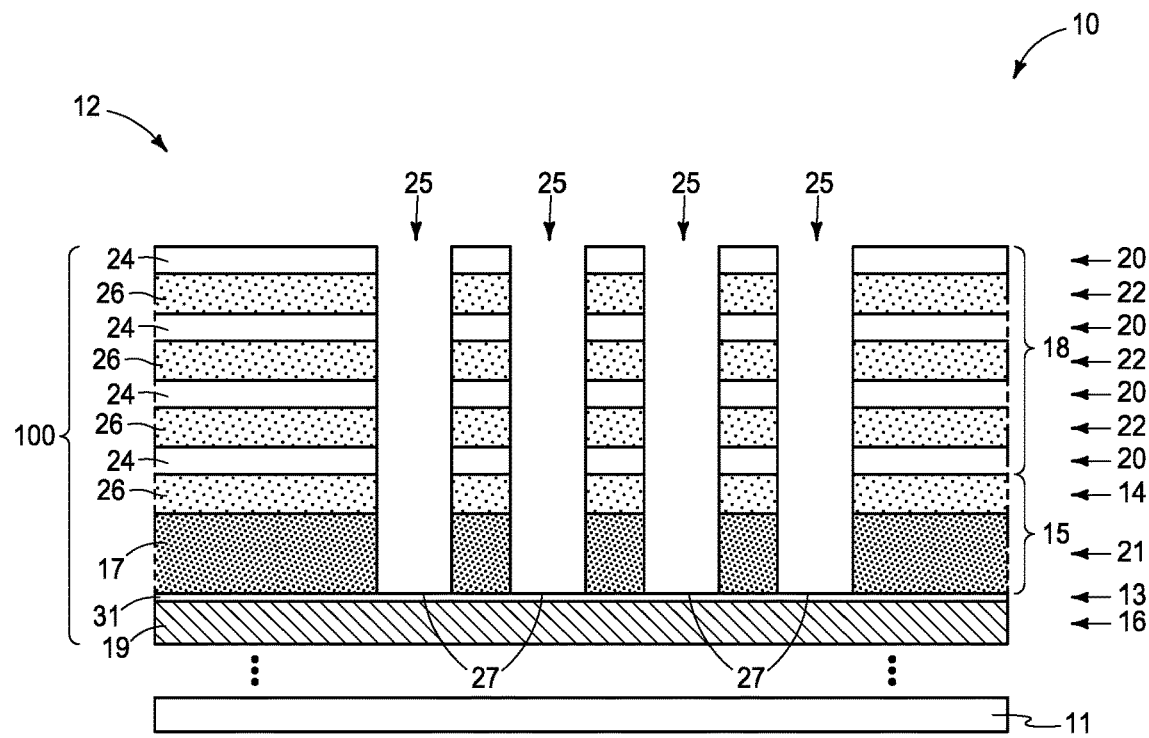

Referring to FIG. 4, etching has been conducted through the another select gate tier 21 to extend individual channel openings 25 there-through to and stopping on insulator etch-stop tier 13 to form individual bottoms 27 of channel openings 25 to comprise insulator etch-stop tier 13. Such etching may stop on an uppermost surface of insulator etch-stop tier 13 as shown. Alternately, such etching may go into insulator etch-stop tier 13 (not shown) and, if so, individual bottoms 27 may be at different depths in insulator etch-stop tier 13.

Figure 5:
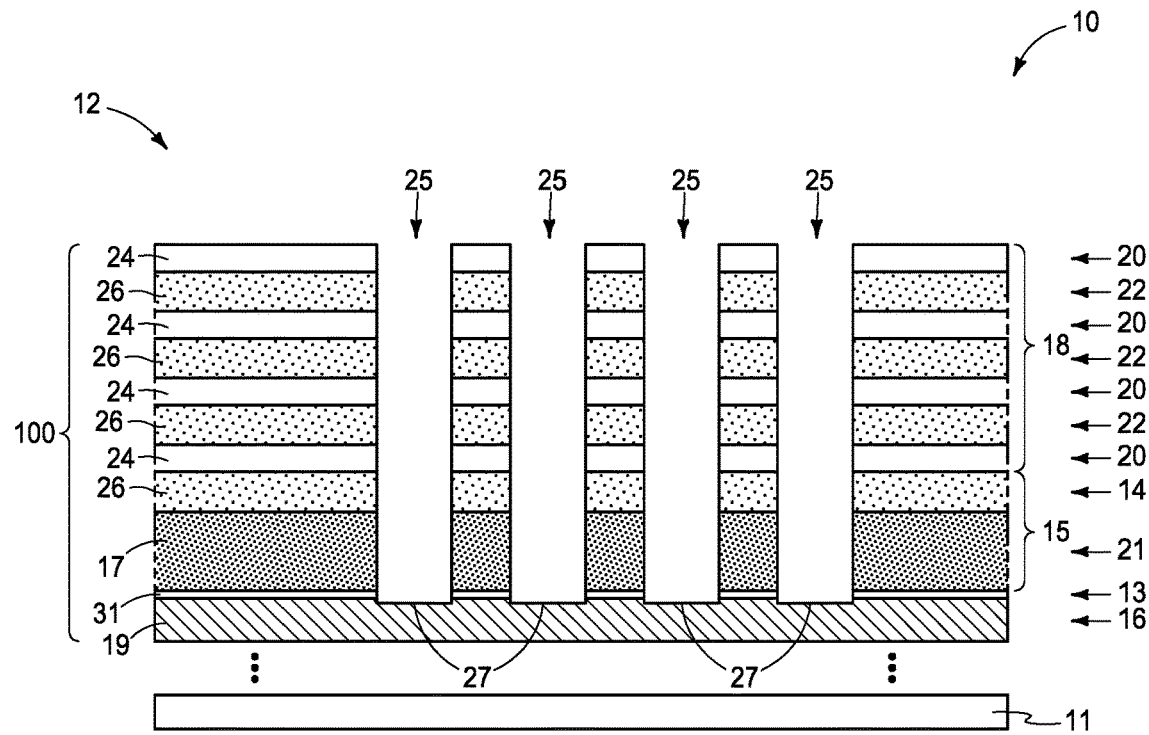

Referring to FIG. 5, insulator etch-stop tier 13 has been penetrated though (e.g., by etching) to extend individual channel openings 25 there-through to conductive tier 16. Channel-opening bottoms 27 may be within conductive tier 16, for example as shown and may be at different depths therein (not shown).

Transistor channel material is formed in the individual channel openings elevationally along the insulative tiers, the wordline tiers, and the select gate tier and is directly electrically coupled with conductive material in the conductive tier. In one such embodiment, the channel material is formed elevationally along the one select gate tier and the another select gate tier. Individual memory cells of the array may be formed to comprise a gate region (e.g., a control-gate region) and a memory structure laterally between the gate region and the channel material. In one such embodiment, the memory structure is formed to comprise a charge-blocking region, storage material (e.g., charge-storage material), and insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the storage material.

Figure 6:
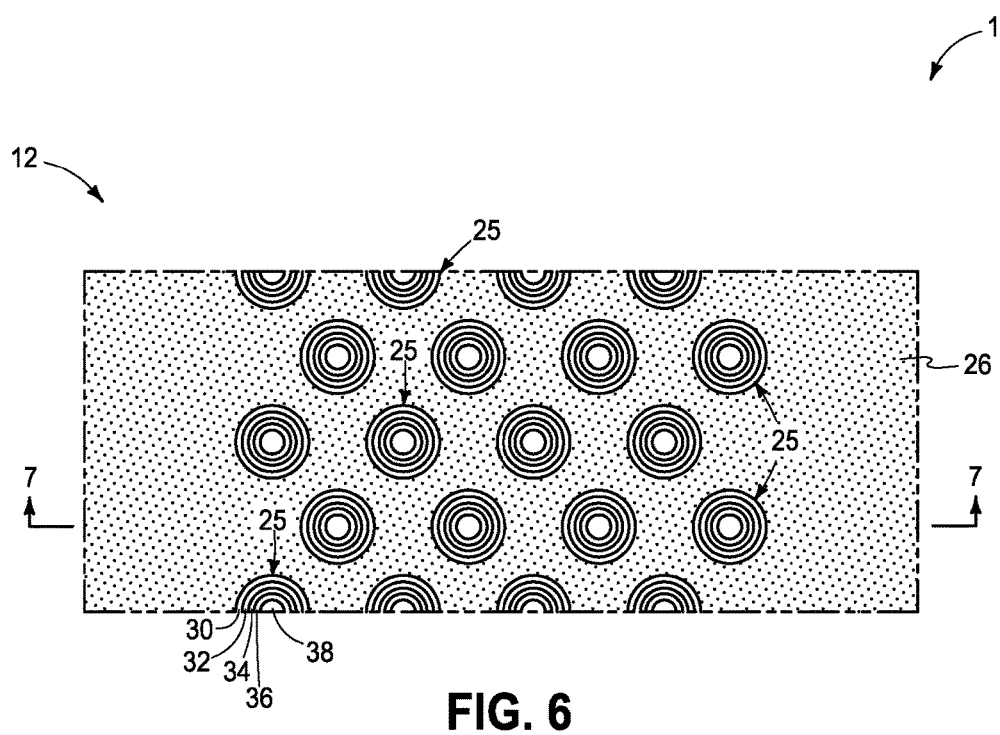
Figure 7:
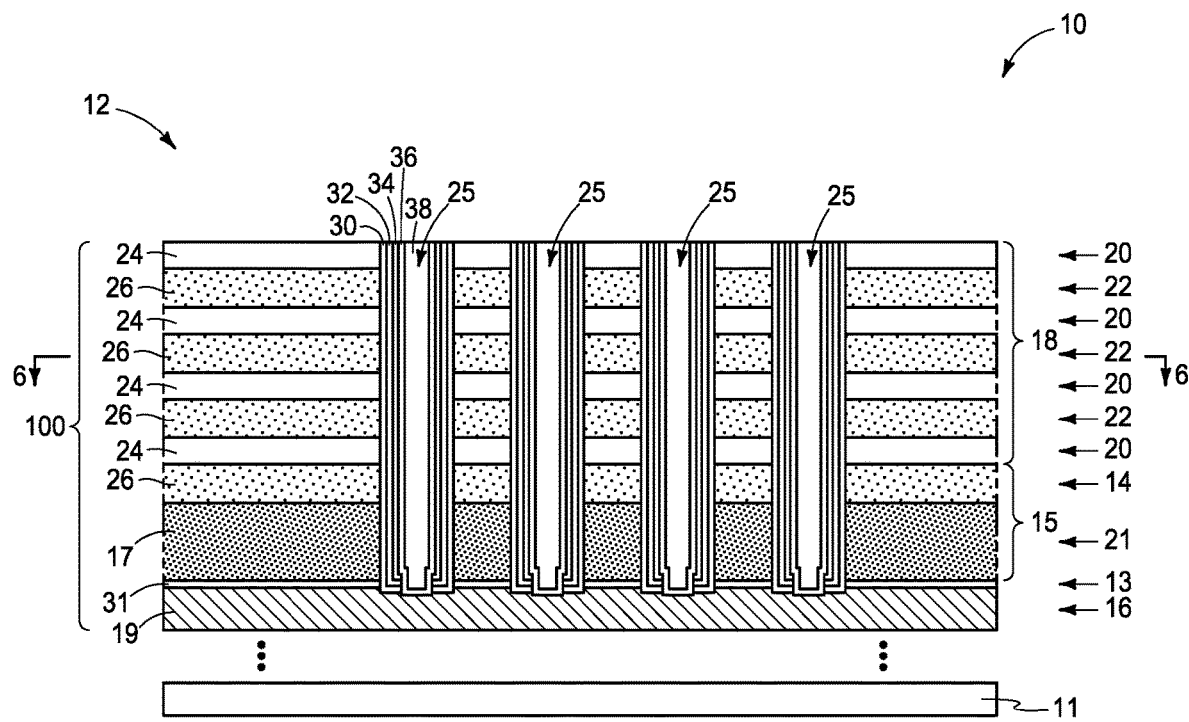

FIGS. 6 and 7 show one embodiment wherein charge-blocking material 30, storage material 32, and charge-passage material 34 have been formed in individual channel openings 25 elevationally along insulative tiers 20, wordline tiers 22, and the one or more select gate tiers. Transistor materials 30, 32 and 34 (e.g., memory cell materials) may be formed by, for example, deposition of respective thin layers thereof over stack 18 and within individual channel openings 25 followed by planarizing such back at least to an uppermost surface of stack 18. Channel material 36 has been formed in channel openings 25 elevationally along insulative tiers 20 and wordline tiers 22. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductive tier 16 such that channel material 36 is directly against conductive material 19 of conductive tier 16. Alternately, and by way of example only, no punch etching may be conducted and channel material 36 may be directly electrically coupled to material 19 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 8:
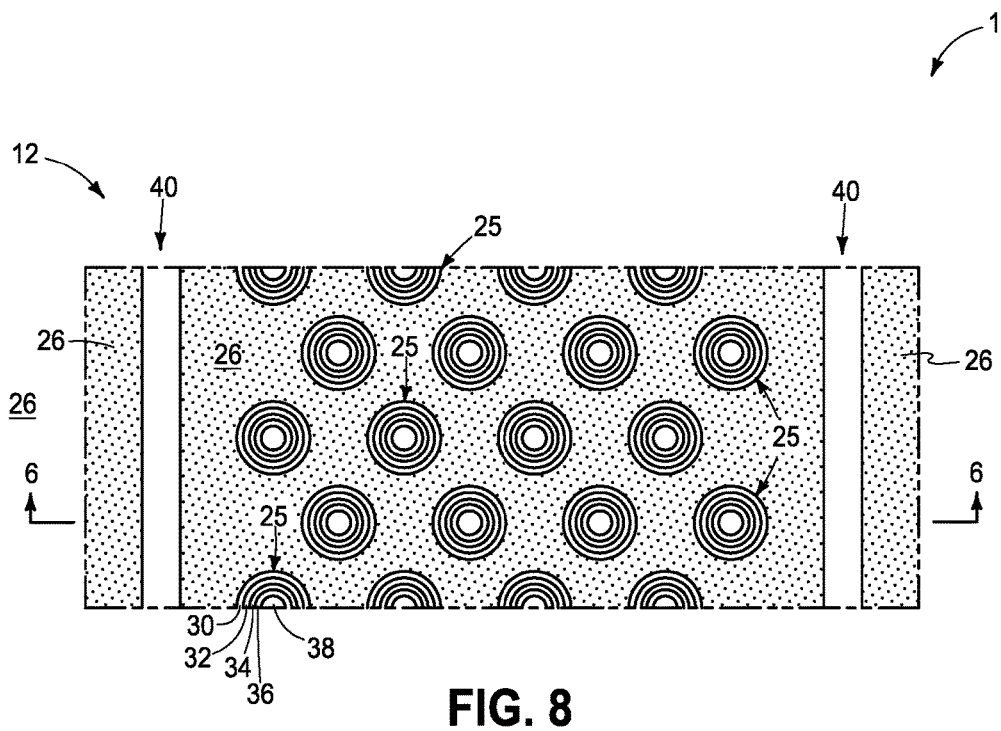
Figure 9:
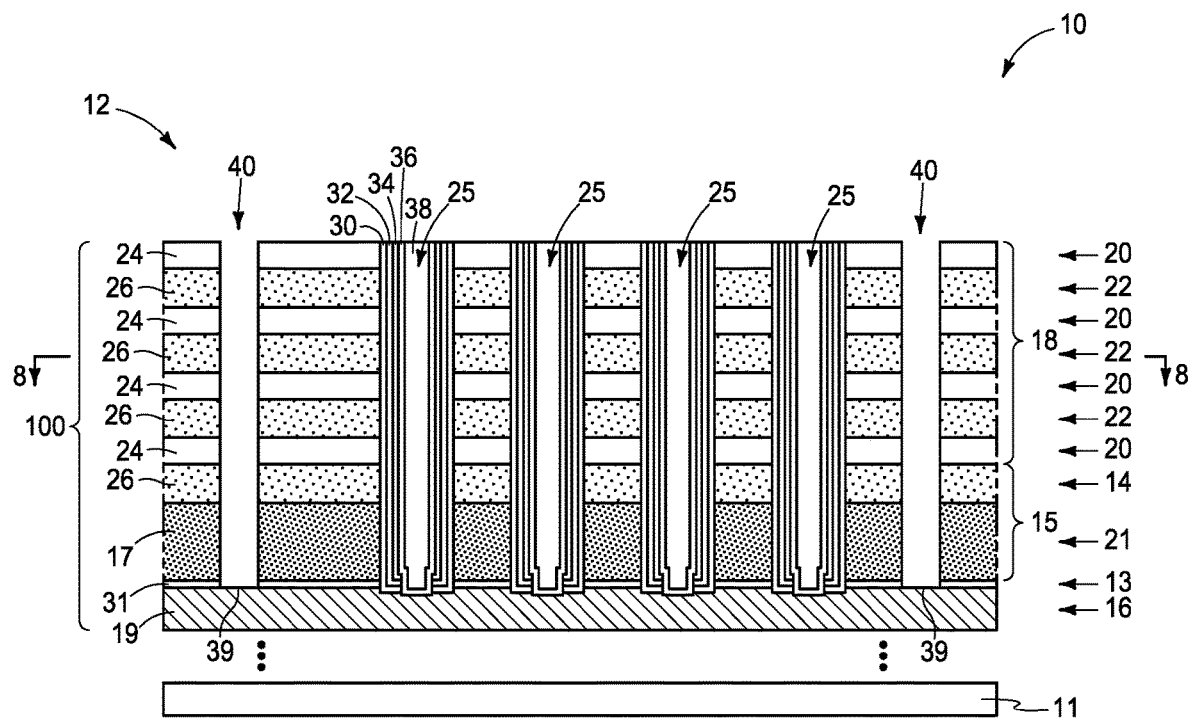

Referring to FIGS. 8 and 9, horizontally-elongated trenches 40 have been formed (e.g., by anisotropic etching) through stack 18 and stack 15 to conductive tier 16. In one embodiment and as shown, horizontally-elongated trenches 40 have respective bottoms 39 that are directly against conductive material 19 of conductive tier 16. Alternately, bottoms 39 are above conductive material 19 of conductive tier 16 (e.g., atop or within insulator etch-stop tier 13 and not shown).

Figure 10:
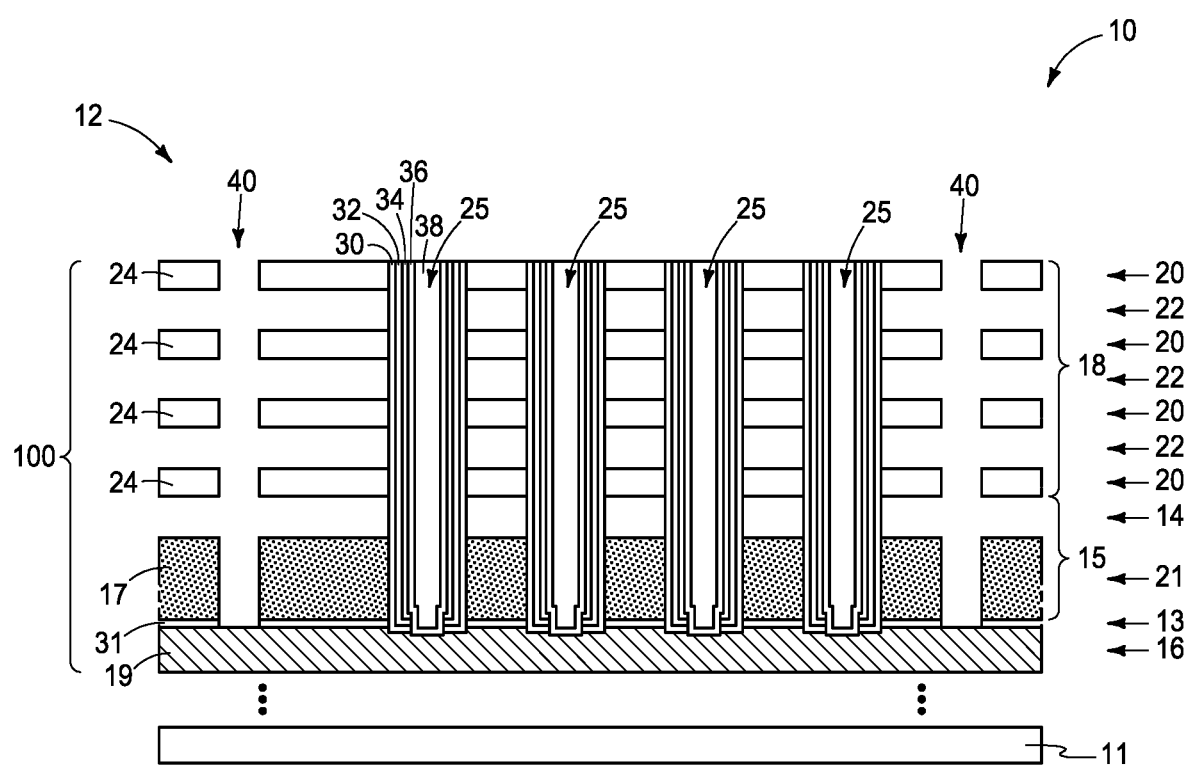

Referring to FIG. 10, material 26 (not shown) of wordline tiers 22 and select gate tier 14 has been etched selectively relative to materials 24, 17, 30, 32, 34, 36, and 38 (e.g., using liquid or vapor $H_3PO_4$ as a primary etchant where material 26 is silicon nitride, material 24 is silicon dioxide, and material 17 is polysilicon).

Figure 11:
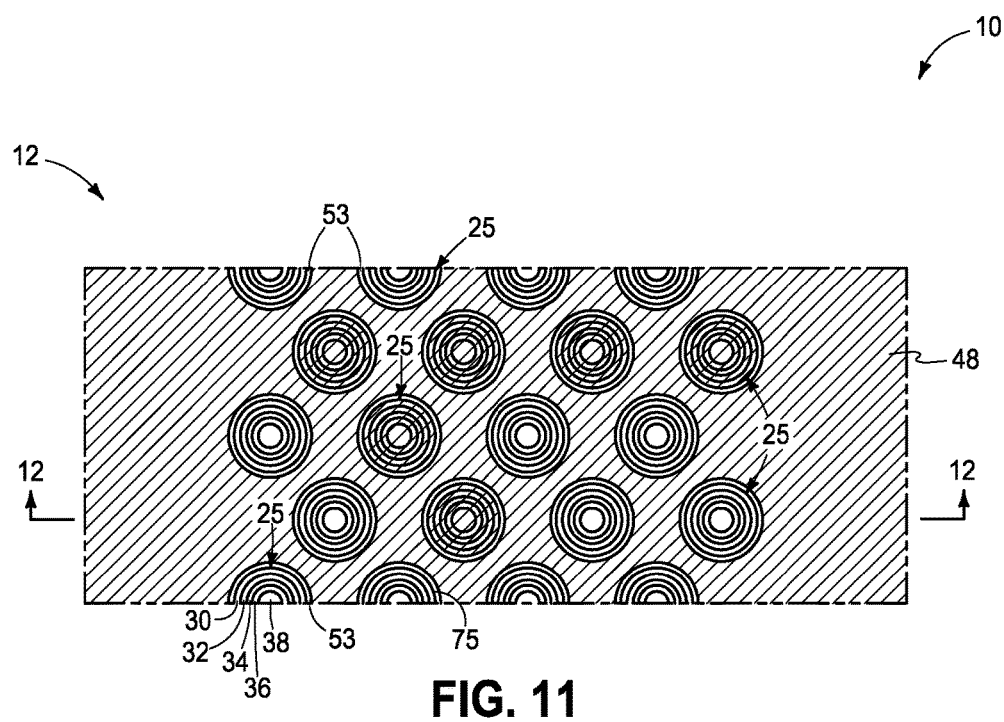
Figure 12:
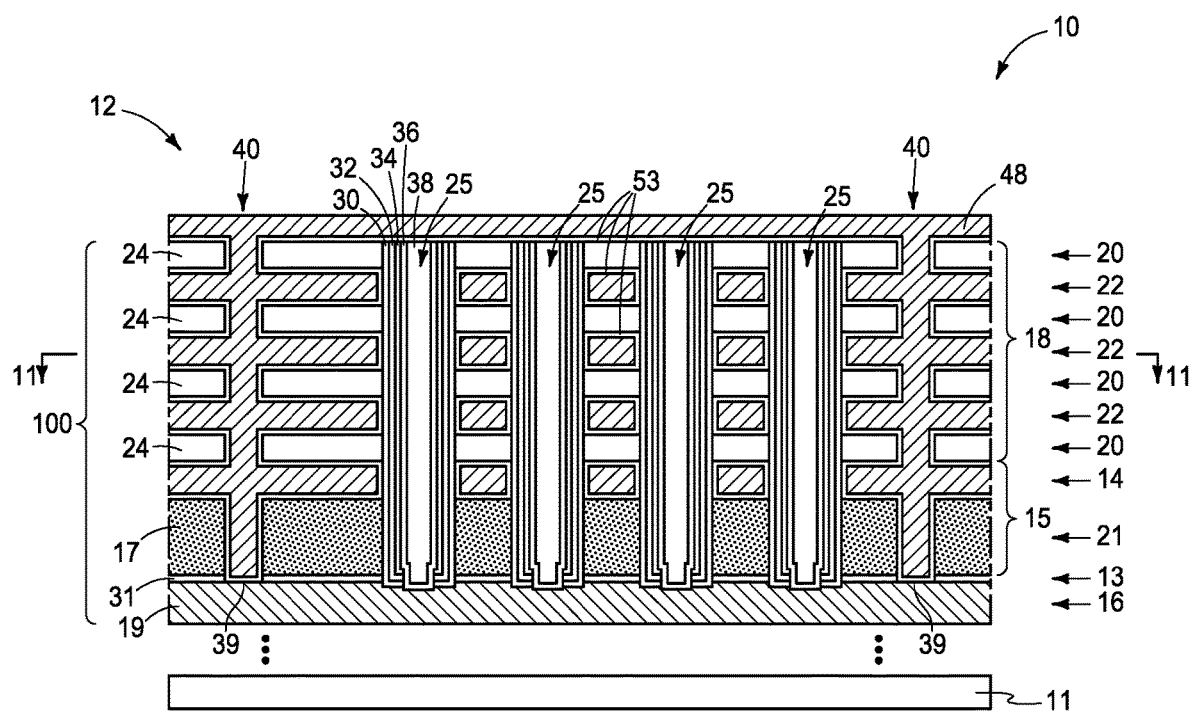

Conducting material is ultimately formed into wordline tiers 22 and into the one or more select gate tiers and which will comprise conducting material of the individual wordlines and select gates to be formed. Referring to FIGS. 11 and 12, such show an example embodiment wherein an insulating material 53 (e.g., at least one of $Al_2O_3$ and $HfO_x$) has been formed into wordline tiers 22 and into select gate tier 14 through trenches 40 followed by forming conducting material 48 into wordline tiers 22 and into select gate tier 14 through trenches 40. Any suitable conducting material 48 may be used, for example one or both of metal material (e.g., elemental tungsten) and/or conductively-doped semiconductive material. In but one example embodiment, conducting material 48 comprises a first-deposited conformal titanium nitride liner (not shown) followed by deposition of another composition metal material (e.g., elemental tungsten).

Figure 13:
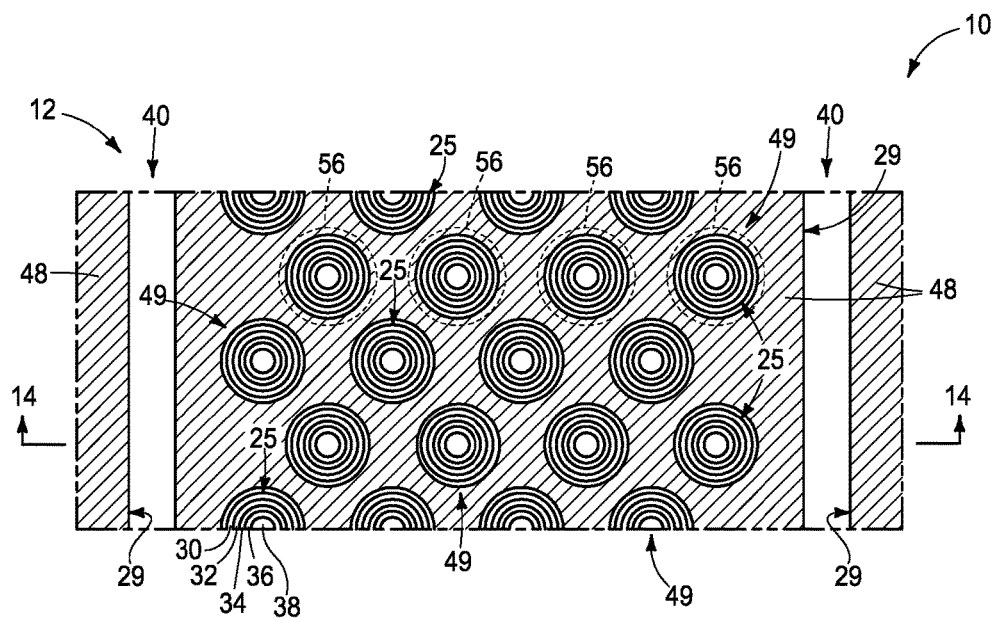
Figure 14:
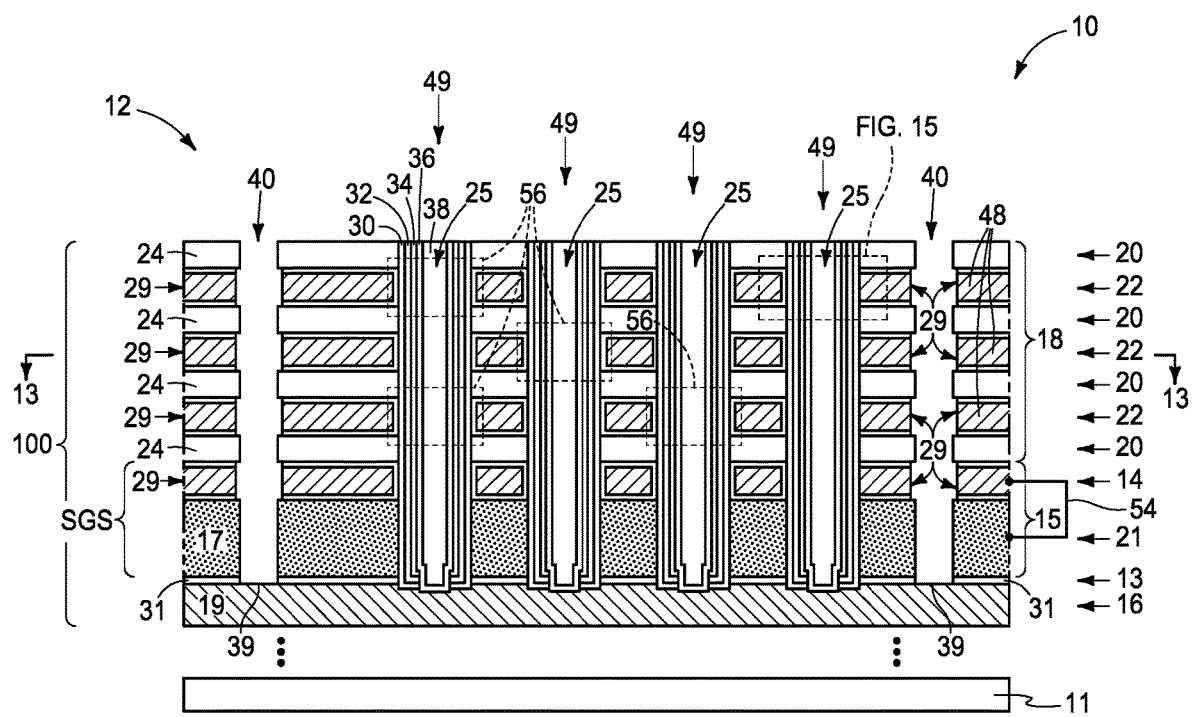
Figure 15:
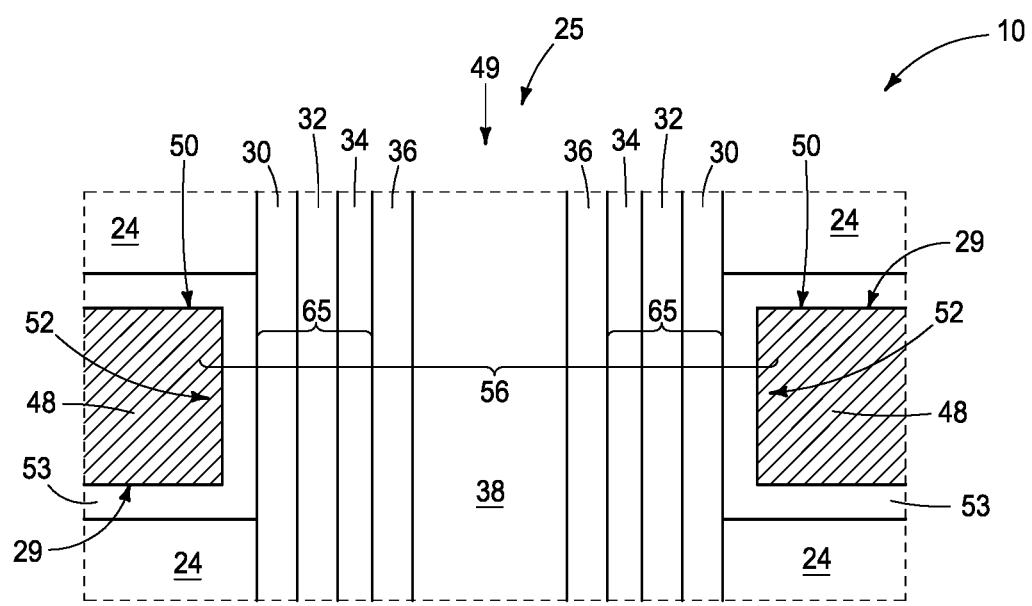

Referring to FIGS. 13-15, conducting material 48 and insulating material 53 have been removed from individual trenches 40. Such has resulted in formation of wordlines 29 and elevationally-extending strings 49 of individual transistors and/or memory cells 56. Such removing may be conducted by etching, for example by one or both of anisotropic etching or isotropic etching. In one isotropic etching example, trenches 40 can be formed to be wider than the vertical depth of individual wordline tiers 22 (not shown). Conducting material 48 can then be deposited to a thickness that less-than-fills trenches 40 (not shown), for example to leave a laterally-centered void space within trenches 40 (not shown). Thereafter, such conducting material can be isotropically etched within the void space to form wordlines 29 that are separated as is shown by the depicted FIGS. 13 and 14 cross-sections. Approximate locations of transistors and/or memory cells 56 are indicated with a bracket in FIG. 15 and some with dashed outlines in FIGS. 13 and 14, with transistors and/or memory cells 56 being essentially ring-like or annular in the depicted example. Conducting material 48 may be considered as having terminal ends 50 (FIG. 15) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

In the example embodiment, a select gate (e.g., SGS) is ultimately formed that is in the one select gate tier 14 and in the another select gate tier 21, with such select gate comprising conducting material 48 in the one select gate tier 14 and conductor material 17 in the another select gate tier 21. When insulating material 53 is vertically between and vertically separates a conducting metal material 48 and a conductively-doped semiconductive material 17 proximate channel material 36, such insulating material may be sufficiently thin and leaky that such materials 48 and 17 are effectively directly electrically coupled together. Further and regardless, conducting material 48 in the one select gate tier 14 and conductor material 17 in the another select gate tier 21 may be directly coupled to one another distal the channel material, for example at edges of the array as schematically shown by an interconnect 54 in FIG. 14.

Figure 16:
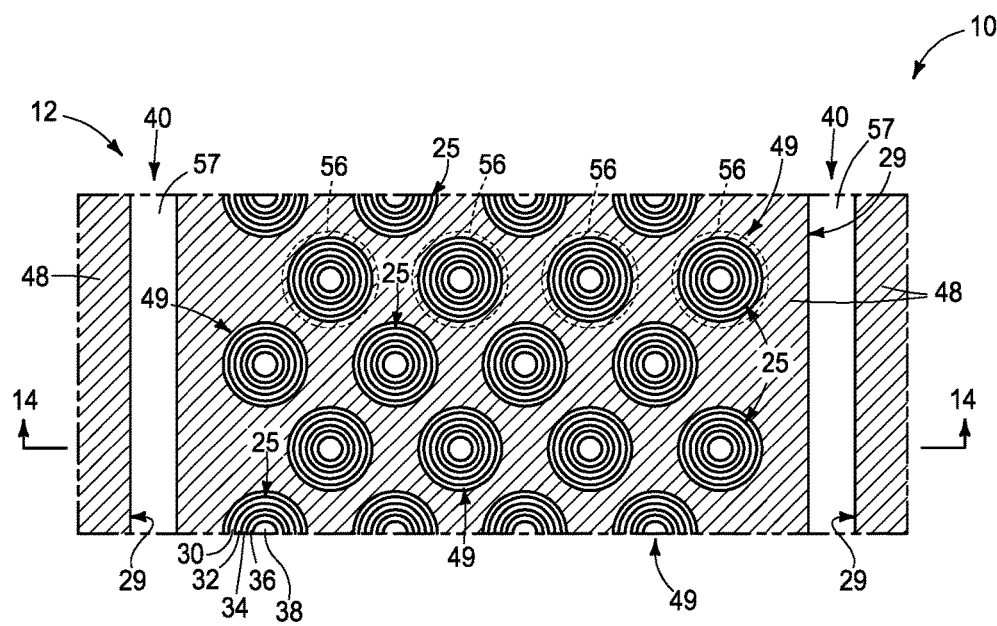
Figure 17:
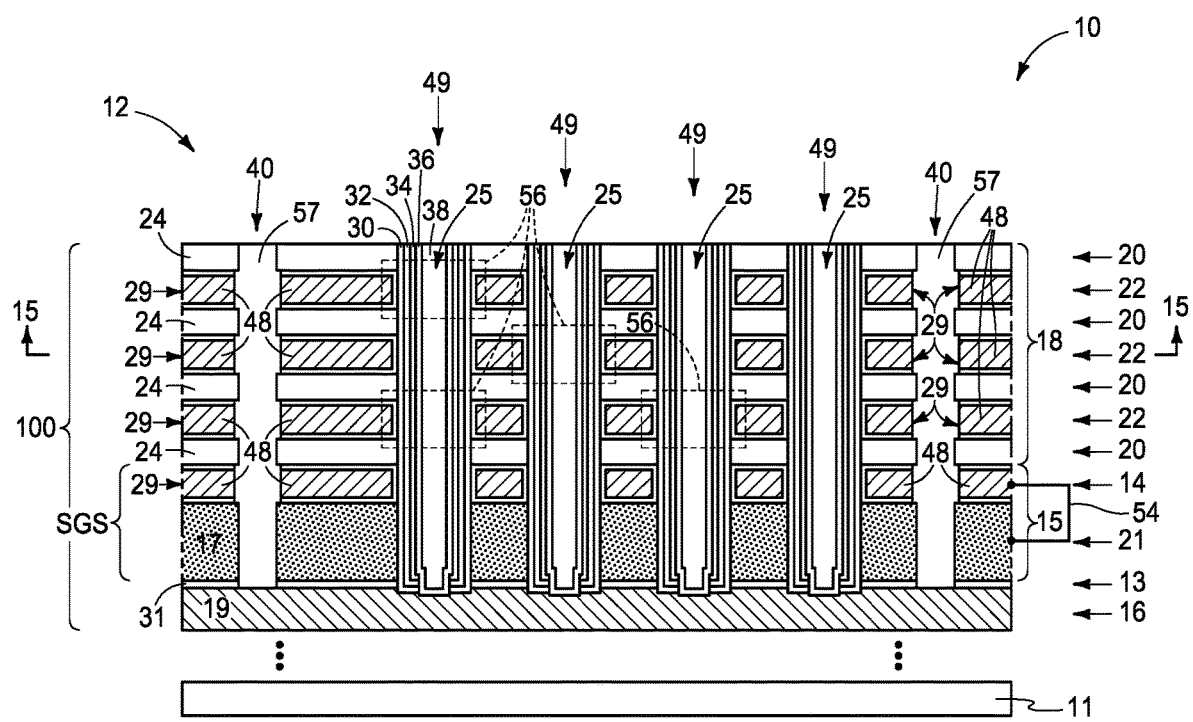

Referring to FIGS. 16 and 17, a material 57 (dielectric and/or silicon-containing such as undoped polysilicon) has been formed in individual trenches 40.

Any other attribute(s) or aspect(s) as shown and/or described herein with respect to other embodiments may be used with respect to the above-described embodiments.

The above example processing shows forming conducting material 48 of individual wordlines 29 in wordline tiers 22 after forming channel material 36. Alternately, and by way of example only, the conducting material of the individual wordlines in the wordline tiers may be formed before forming channel material 36, including even before forming channel openings 25.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a vertical stack (e.g., 100) comprising a conductive tier (e.g., 16), an insulator tier (e.g., 13) above the conductive tier, and a first stack (e.g., 15) above the insulator tier. The first stack comprises multiple select gate tiers (e.g., 21, 14) above the insulator tier. One of the select gate tiers (e.g., 14) comprises conducting metal material and another of the select gate tiers (e.g., 21) comprises conductively-doped semiconductive material (e.g., 17). A second stack (e.g., 18) comprises vertically-alternating insulative tiers (e.g., 20) and wordline tier (e.g., 22) and is above the first stack. The wordline tiers comprise gate regions (e.g., 52) of individual memory cells (e.g., 56), with individual of the gate regions comprising part of a wordline (e.g., 29) in individual of the wordline tiers. Channel material (e.g., 36) extends elevationally through the insulative tiers, the wordline tiers, the one select gate tier, and the another select gate tier and is directly electrically coupled with conductive material (e.g., 19) in the conductive tier. The individual memory cells comprise a memory structure (e.g., 65) between the individual gate regions and the channel material. The memory structure comprises a charge-blocking region (e.g., 30) laterally inward of the individual gate regions, a storage region (e.g., 32) laterally inward of individual of the charge-blocking regions, and insulative charge-passage material (e.g., 34) laterally inward of individual of the storage regions. A select gate (e.g., SGS) is in the one select gate tier (e.g., 14) and in the another select gate tier (e.g., 21). The select gate comprises the conducting metal material (e.g., 48) in the one select gate tier (e.g., 14) and the conductively-doped semiconductive material (e.g., 17) in the another select gate tier (e.g., 21)

In one embodiment, the conductively-doped semiconductive material is vertically thicker than the conducting metal material, and in one embodiment the conducting metal material is above the conductively-doped semiconductive material. In one embodiment, the conductively-doped semiconductive material comprises conductively-doped polysilicon. In one embodiment, the memory array comprises NAND, and in one embodiment comprises CMOS under array circuitry electrically coupled to at least one of (a) the conductive tier, (b) the select gate tier, and (c) the wordlines. In one embodiment, the memory array comprises an insulating material (e.g., 53) vertically between and vertically separating the conducting metal material and the conductively-doped semiconductive material proximate the channel material, with the conducting metal material in the one select gate tier and the conductively-doped semiconductive material in the another select gate tier being directly coupled to one another distal the channel material. In one embodiment, horizontally-elongated insulator structures (e.g., 57) extend elevationally through the insulative tiers and the wordline tiers, with the horizontally-elongated insulator structures laterally separating individual wordlines in individual of the wordline tiers.

Any other attribute(s) or aspect(s) as shown and/or described herein with respect to other embodiments may be used.

Figure 18:
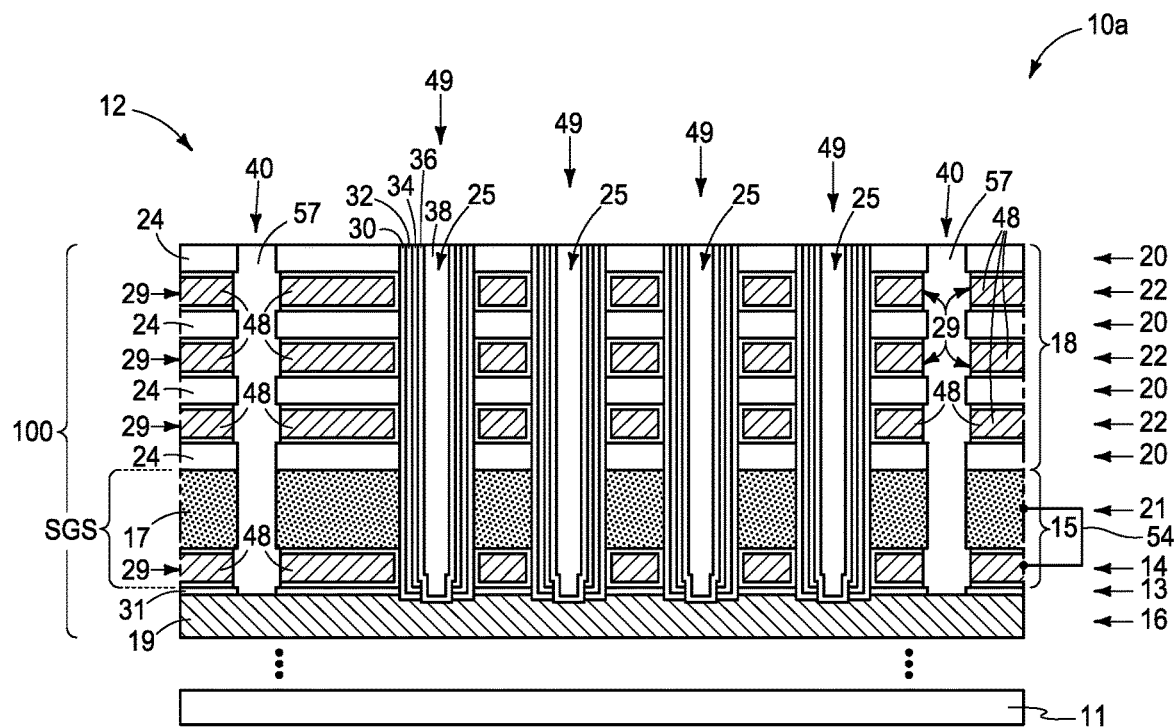
FIGS. 18-20 are diagrammatic cross-sectional views of a portion of substrates in accordance with embodiments of the invention.

In one embodiment, the conducting metal material (e.g., 48) is below the conductively-doped semiconductive material (e.g., 17), for example as shown in an alternate embodiment construction 10a in FIG. 18. Like numerals from the above-described embodiments have been used where appropriate with some construction differences being indicated with the suffix "a". Any other attribute(s) or aspect(s) as shown and/or described herein with respect to other embodiments may be used.

Figure 19:
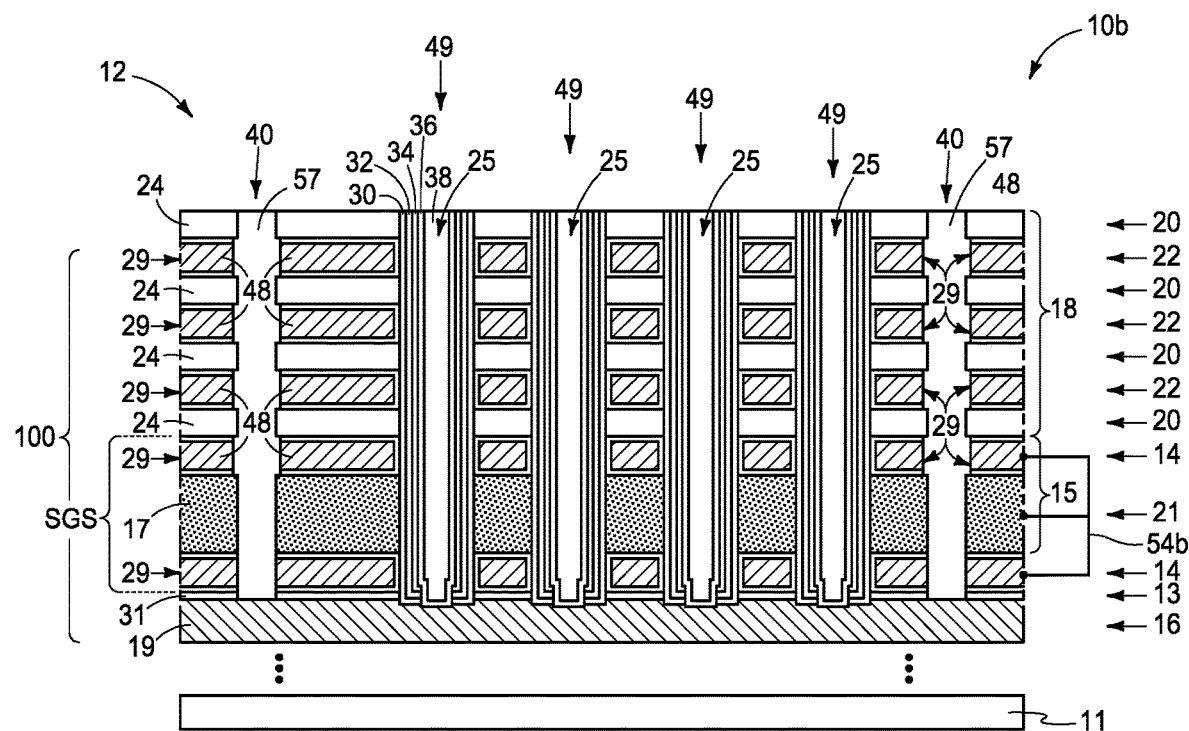

In one embodiment, the first stack (e.g., 15) comprises at least three select gate tiers (e.g., 14, 21) comprising vertically-alternating conducting metal material (e.g., 48) and conductively-doped semiconductive material (e.g., 17), for example as is shown in an alternate embodiment construction 10b in FIG. 19. Like numerals from the above-described embodiments have been used where appropriate with some construction differences being indicated with the suffix "b". Example construction 10b is shown as comprising a select gate tier 21 sandwiched vertically between two select gate tiers 14. Regardless, and in one such embodiment as shown, the memory array comprises more conducting metal material tiers (e.g., 14) than conductively-doped semiconductive material tiers (e.g., 21). In one embodiment, at least one of the conductively-doped semiconductive material tiers is vertically thicker than each of the conducting metal material tiers, and in one such embodiment at least one of the conductively-doped semiconductive material tiers is at least vertically twice as thick as each of the conducting metal material tiers. A conductive interconnect 54b may directly electrically couple the at least three select gate tiers together. Any other attribute(s) or aspect(s) as shown and/or described herein with respect to other embodiments may be used.

Figure 20:
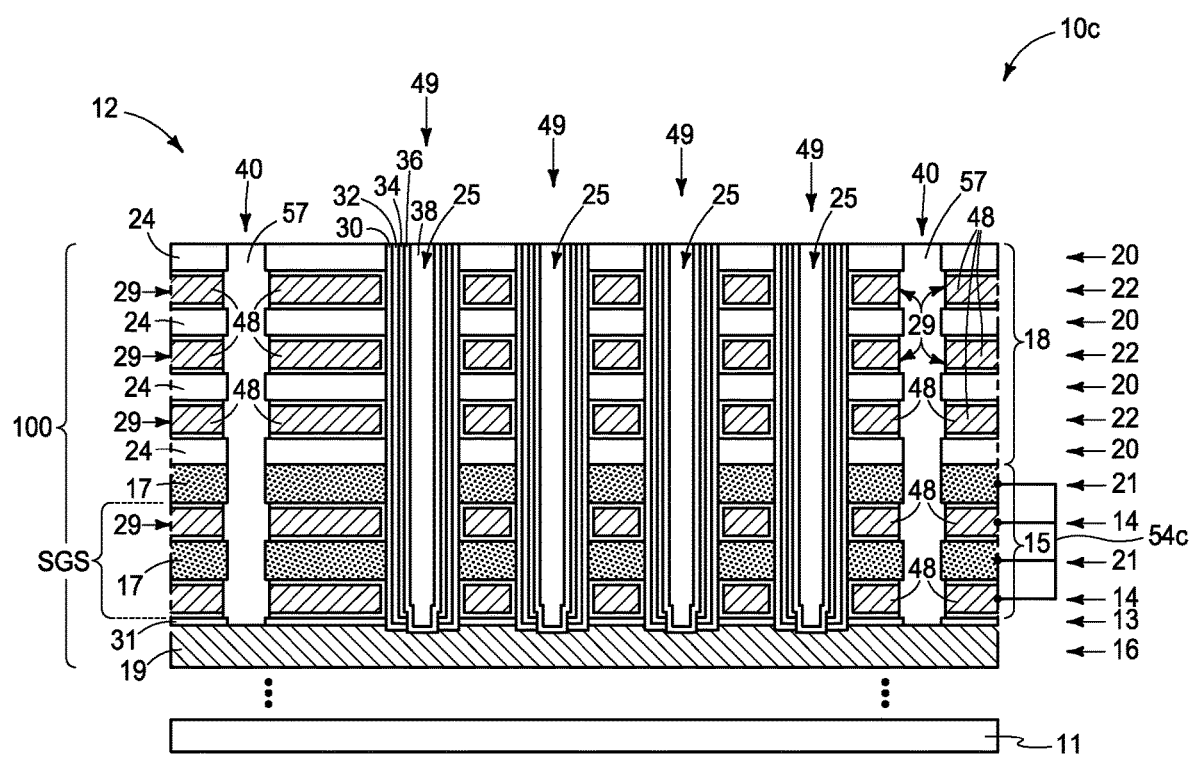

In one embodiment, the first stack (e.g., 15) comprises at least four select gate tiers (e.g., 14, 21) comprising vertically-alternating conducting metal material (e.g., 48) and conductively-doped semiconductive material (e.g., 17), for example as shown with respect to an alternate embodiment construction 10c in FIG. 20. Like numerals from the above-described embodiments have been used where appropriate with some construction differences being indicated with the suffix "c". In one embodiment, the conductively-doped semiconductive material (e.g., 17) in at least one of the conductively-doped semiconductive material tiers (e.g., 21) is vertically thicker than the conducting metal material (e.g., 48) in each of the conducting metal material tiers (e.g., 14, and as shown), and in one embodiment, the conductively-doped semiconductive material (e.g., 17) in each of the conductively-doped semiconductive material tiers (e.g., 21) is vertically thinner than the conducting metal material (e.g., 48) in each of the conducting metal material tiers (e.g., 14, and not shown). A conductive interconnect 54c may directly electrically couple the at least four select gate tiers together. Any other attribute(s) or aspect(s) as shown and/or described herein with respect to other embodiments may be used In one embodiment, a memory array (e.g., 12) comprises a vertical stack (e.g., 100) comprising a conductive tier (e.g., 16), an insulator tier (e.g., 13) above the conductive tier, and a first stack (e.g., 15) above the insulator tier. The first stack comprises multiple select gate tiers (e.g., 21, 14) above the insulator tier. One of the select gate tiers (e.g., 14) comprises select gate conducting material (e.g., 48) and another of the select gate tiers (e.g., 21) comprises select gate conductor material (e.g., 17), with the select gate conductor material (e.g., 17) being vertically thicker than the select gate conducting material (e.g., 48). A second stack comprises vertically-alternating insulative tiers (e.g., 20) and wordline tiers (e.g., 22) and is above the first stack. The wordline tiers comprise gate regions (e.g., 52) of individual memory cells (e.g., 56), with individual of the gate regions comprising part of a wordline (e.g., 29) in individual of the wordline tiers. Channel material (e.g., 36) extends elevationally through the insulative tiers, the wordline tiers, the one select gate tier, and the another select gate tier and is directly electrically coupled with conductive material (e.g., 19) in the conductive tier. The individual memory cells comprise a memory structure (e.g., 65) between the individual gate regions and the channel material. The memory structure comprises a charge-blocking region (e.g., 30) laterally inward of the individual gate regions, a storage region (e.g., 32) laterally inward of individual of the charge-blocking regions, and insulative charge-passage material (e.g., 34) laterally inward of individual of the storage regions. A select gate (e.g., SGS) is in the one select gate tier (e.g., 14) and in the another select gate tier (e.g., 21). The select gate comprises the select gate conducting material (e.g., 48) in the one select gate tier (e.g., 14) and the select gate conductor material (e.g., 17) in the another select gate tier (e.g., 21). Any other attribute(s) or aspect(s) as shown and/or described herein with respect to other embodiments may be used.

Constructions in accordance with the invention may increase desired leakage (e.g., gate induced drain leakage [GIDL]) of an SGS.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

Conclusion

In some embodiments, a method used in forming a memory array, comprises forming a substrate comprising a conductive tier, an insulator etch-stop tier above the conductive tier, a select gate tier above the insulator etch-stop tier, and a stack comprising vertically-alternating insulative tiers and wordline tiers above the select gate tier. Etching is conducted through the insulative tiers, the wordline tiers, and the select gate tier to and stopping on the insulator etch-stop tier to form channel openings that have individual bottoms comprising the insulator etch-stop tier. The insulator etch-stop tier is penetrated through to extend individual of the channel openings there-through to the conductive tier. Channel material is formed in the individual channel openings elevationally along the insulative tiers, the wordline tiers, and the select gate tier and is directly electrically coupled with the conductive material in the conductive tier.

In some embodiments, a method used in forming a memory array comprises forming a substrate comprising a conductive tier, an insulator etch-stop tier above the conductive tier, a first stack comprising multiple select gate tiers above the insulator etch-stop tier, and a second stack comprising vertically-alternating insulative tiers and wordline tiers above the first stack. Etching is conducted through the insulative tiers, the wordline tiers, and one of the select gate tiers to and stopping on conductor material in another of the select gate tiers that is below the one select gate tier to form channel openings that have individual bottoms comprising the conductor material in the another select gate tier. The another select gate tier is etched through to extend individual of the channel openings there-through to and stopping on the insulator etch-stop tier to form the individual bottoms of the channel openings to comprise the insulator etch-stop tier. The insulator etch-stop tier is penetrated through to extend individual of the channel openings there-through to the conductive tier. Channel material is formed in the individual channel openings elevationally along the insulative tiers, the wordline tiers, the one select gate tier, and the another select gate tier and is directly electrically coupled with the conductive material in the conductive tier. A select gate is formed that is in the oneselect gate tier and in the another select gate tier. The select gate comprises conducting material in the one select gate tier and the conductor material in the another select gate tier.

In some embodiments, a memory array comprises a vertical stack comprising a conductive tier, an insulator tier above the conductive tier, and a first stack comprising multiple select gate tiers above the insulator tier. One of the select gate tiers comprises conducting metal material, and the another of the select gate tiers comprises conductively-doped semiconductive material. A second stack comprises vertically-alternating insulative tiers and wordline tiers and is above the first stack. The wordline tiers comprise gate regions of individual memory cells, with individual of the gate regions comprising part of a wordline in individual of the wordline tiers. Channel material extends elevationally through the insulative tiers, the wordline tiers, the one select gate tier, and the another select gate tier and is directly electrically coupled with the conductive material in the conductive tier. The individual memory cells comprise a memory structure between the individual gate regions and the channel material. The memory structure comprises a charge-blocking region laterally inward of the individual gate regions, a storage region laterally inward of individual of the charge-blocking regions, and insulative charge-passage material laterally inward of individual of the storage regions, and a select gate in the one select gate tier and in the another select gate tier. The select gate comprises the conducting material in the one select gate tier and the conductor material in the another select gate tier.

In some embodiments, a memory array comprises a vertical stack comprising a conductive tier, an insulator tier above the conductive tier, and a first stack comprising multiple select gate tiers above the insulator tier. One of the select gate tiers comprise select gate conducting material, and another of the select gate tiers comprise select gate conductor material. The select gate conductor material is vertically thicker than the select gate conducting material. A second stack comprises vertically-alternating insulative tiers and wordline tiers above the first stack. The wordline tiers comprise gate regions of individual memory cells, and individual of the gate regions comprise part of a wordline in individual of the wordline tiers. Channel material extends elevationally through the insulative tiers, the wordline tiers, the one select gate tier, and the another select gate tier and is directly electrically coupled with the conductive material in the conductive tier. The individual memory cells comprise a memory structure between the individual gate regions and the channel material. The memory structure comprises a charge-blocking region laterally inward of the individual gate regions, a storage region laterally inward of individual of the charge-blocking regions, an insulative charge-passage material laterally inward of individual of the storage regions, and a select gate in the one select gate tier and in the another select gate tier. The select gate comprises the conducting material in the one select gate tier and the conductor material in the another select gate tier.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory array, comprising:
 a substrate comprising a conductive tier, an insulator etch-stop tier above the conductive tier, a first select gate tier above the insulator etch-stop tier, a second select gate tier above the first select gate tier, and a stack comprising vertically-alternating insulative tiers and wordline tiers above the second select gate tier, the first select gate tier comprising a conductively-doped semiconductive material, the second select gate tier comprising a conducting metal material;
 an insulating material vertically between and vertically separating the conducting metal material of the second select gate tier and the conductively-doped semiconductive material of the first select gate tier, the conducting metal material in the second select gate tier and the conductively-doped semiconductive material in the first select gate tier being directly electrically coupled to one another through leaks through the insulative material;
 a channel opening extending through the insulative tiers, the wordline tiers, the first and second select gate tiers, and the insulator etch-stop tier, the channel opening having a base surface on the conductive tier;
 a charge-blocking material in the channel opening, the charge-blocking material extending continuously along the insulative tiers, the wordline tiers, the first and second select gate tiers, and the insulator etch-stop tier to directly contact the upper surface of the conductive tier; and
 a channel material in the channel opening extending elevationally along the insulative tiers, the wordline tiers, and the first and second select gate tiers and being in direct physical contact with the upper surface and directly electrically coupled with the conductive material in the conductive tier.

2. The memory array of claim 1 wherein the insulator etch-stop tier comprises silicon dioxide.

3. The memory array of claim 1 wherein the insulator etch-stop tier comprises silicon nitride.

4. The memory array of claim 1 wherein the insulator etch-stop tier comprises an insulative metal oxide comprising multiple different metal elements.

5. The memory array of claim 1 wherein the insulator etch-stop tier is vertically thinner than the first select gate tier.

6. The memory array of claim 1 wherein the insulator etch-stop tier is vertically thinner than each of the insulative tiers and the wordline tiers.

7. A memory array comprising:
 a vertical stack comprising:
 a conductive tier;
 an insulator tier above the conductive tier;
 a first stack comprising multiple select gate tiers above the insulator tier, a first of the select gate tiers comprising select gate conducting material comprising elemental W and comprising at least one of $Al_2O_3$ and $HfO_x$, a second of the select gate tiers comprising select gate conductor material, the select gate conductor material being vertically thicker than the select gate conducting material; and a second stack comprising vertically-alternating insulative tiers and wordline tiers above the first stack, the wordline tiers comprising gate regions of individual memory cells, individual of the gate regions comprising part of a wordline in individual of the wordline tiers;

a channel material structure extending elevationally continuously through the insulative tiers, the wordline tiers, the first select gate tier, and the second select gate tier, the channel material being directly electrically coupled with conductive material in the conductive tier;

each of the individual memory cells comprising a memory structure between the individual gate regions and the channel material; the memory structure comprising a charge-blocking region laterally inward of the individual gate regions, a storage region laterally inward of individual of the charge-blocking regions, and insulative charge-passage material laterally inward of individual of the storage regions, the charge-blocking regions extending continuously along the wordline tiers, along the select gate tiers, and along the insulator tier, and directly contacting the upper surface of the conductive tier; and a select gate in the first select gate tier and in the second select gate tier, the select gate comprising the select gate conducting material in the first select gate tier and the select gate conductor material in the second select gate tier.

8. The memory array of claim 7 comprising horizontally-elongated insulator structures extending elevationally through the insulative tiers and the wordline tiers, the horizontally-elongated insulator structures laterally separating individual wordlines in individual of the wordline tiers.

9. The memory array of claim 7 comprising NAND.

10. The memory array of claim 9 comprising CMOS under array circuitry electrically coupled to at least one of the conductive tier, the select gate tier, and the wordlines.

* * * * *